United States Patent [19]

Gornati et al.

[11] Patent Number: 5,263,186
[45] Date of Patent: Nov. 16, 1993

[54] CONTROL LOOP FOR REDUCING THE TIME OF REPSONSE OF A TUNER-AGC OF A SUPERHETERODYNE RECEIVER AND RELATIVE LEADING EDGE DIFFERENTIATING CIRCUIT USED IN THE CONTROL LOOP

[75] Inventors: Silvano Gornati, Casorezzo; Giorgio Betti, Milan; Fabrizio Sacchi; Gianfranco Vai, both of Pavia; Maurizio Zuffada, Milan, all of Italy

[73] Assignee: SGS-Thomson Microelectronics s.r.l., Italy

[21] Appl. No.: 641,147

[22] Filed: Jan. 15, 1991

[30] Foreign Application Priority Data

Jan. 17, 1990 [IT] Italy ............... 83601 A/90

[51] Int. Cl.⁵ .............................................. H04B 1/16
[52] U.S. Cl. ........................... 455/241.1; 455/244.1; 455/251.1
[58] Field of Search ................ 455/200.1, 219, 240.1, 455/241.1, 242.1, 242.2, 243.1, 244.1, 245.1, 251.1

[56] References Cited

U.S. PATENT DOCUMENTS

| 3,154,740 | 10/1964 | Eness | 455/244.1 |
| 3,230,458 | 1/1966 | Stangeland | 455/244.1 |
| 4,013,964 | 3/1977 | Skutta | |
| 4,761,687 | 8/1988 | Rumreich | 358/174 |
| 4,827,511 | 5/1989 | Masuko | 455/241.1 X |

FOREIGN PATENT DOCUMENTS 57-2110A 1/1982 Japan .

OTHER PUBLICATIONS

Willigen D. V., "Automatic Input Attenuator for HF Communication Receivers", The Radio and Electronic Engineer, vol. 47, No. 10, pp. 465–469, Oct. 1977.

Primary Examiner—Reinhard J. Eisenzopf
Assistant Examiner—Chi Pham
Attorney, Agent, or Firm—Seed and Berry

[57] ABSTRACT

In a dynamic automatic loop for control of the overall gain of an input circuit of a superheterodyne receiver, the response time of the HF-AGC circuit of the TUNER, in response to the action of the TUNER DELAY circuit activated by the IF-AGC in the case of autonomously uncontrollable abrupt increases in the level of the antenna signal from the same HF-AGC of the TUNER, is markedly reduced using an additional TUNER DELAY PLUS circuit able to absorb for a determined interval of time, a discharge current from the storage capacitor the control voltage of the HF-AGC in addition to the discharge current absorbed by the existing TUNER DELAY circuit. The relevant intensity of this additional discharge current and its duration are optimized by way of suitable circuital arrangements in the design of said TUNER DELAY PLUS circuit. The response time is reduced without modifying the time constant of the HF-AGC, which cannot be freely reduced because of inter- and cross-modulation problems.

21 Claims, 5 Drawing Sheets

ASYMPTOTIC DISCHARGE LEVEL OF C

CONTROL LOOP FOR REDUCING THE TIME OF REPSONSE OF A TUNER-AGC OF A SUPERHETERODYNE RECEIVER AND RELATIVE LEADING EDGE DIFFERENTIATING CIRCUIT USED IN THE CONTROL LOOP

BACKGROUND OF THE INVENTION

1. Field of the Invention

The present invention relates to superheterodyne receivers and more particularly to systems for automatic gain control (AGC) used, in the amplifying and tuning (TUNER) stages and in the intermediate frequency (IF) stages of receivers to compensate for the effects of the variation in intensity of the signal picked up.

2. Description of the Prior Art

A conventional system for superheterodyne TV reception can be represented by the block diagram of FIG. 1. The system comprises a wideband amplification stage provided with a first automatic gain control circuit, a tuner circuit for preselecting the signal, a mixer stage for deriving an intermediate frequency signal from the amplified signal provided by said wideband amplification circuit and by said tuner circuit (indicated as a whole in the figure by the (TUNER+HF-AGC) block), a band filter for said intermediate frequency (indicated in the figure by the IF BAND FILTER block) and by an intermediate frequency circuit comprising at least one amplifier provided with a second automatic gain control circuit (indicated in the figure by the IF+IF-AGC STAGE block). The system is such as to maintain constant the amplitude of the output signal $V_{OUT}$ on variation of the amplitude of the input signal $V_{IN}$ and for this purpose is provided with a first circuit for automatic control of the gain of the tuner, namely with a HF-AGC, with a second circuit for automatic control of the gain of the intermediate frequency stages, namely with a IF-AGC, and with a dynamic automatic control loop for the overall gain of the input circuit of the receiver using a particular circuit commonly known as TUNER DELAY, as indicated in the diagram of FIG. 1. The voltage $V_1$ and $V_3$ regulate respectively the gain of the automatic circuit for control of the gain of the TUNER (HF-AGC), and of the circuit for automatic control of the gain of the intermediate frequency stage (IF-AGC), and these two DC control voltages are respectively stored on two storage capacitors, $C_1$ and $C_2$, indicated in the diagram of FIG. 1. The TUNER DELAY circuit constitutes in practice an "open collector" able to absorb a fixed maximum current (e.g. of the order of 2 mA) $I_1$ in order to discharge the capacitor $C_1$ (decrease $V_1$) and reduce the gain of the TUNER which, for low levels of antenna signal, is maximum, with the purpose of improving the noise pattern of the entire reception system. By way of the variable resistor $R_T$ the voltage level $V_3 = V_{REF}$ (i.e. $V_{REF}$ depending on $R_T$) can be chosen, on the attainment of which is activated the TUNER DELAY circuit which absorbs a current $I_1$ which discharges the capacitor $C_1$ decreasing the voltage $V_1$ of the node 1 by an appropriate value $\overline{V}_1$ asymptotically towards an asymptotic discharge level determined by the product $$R_{(1-2)eq} \cdot I_1$$

where $$R_{(1-2)eq} = \frac{R_1 R_2}{R_1 + R_2}$$

depending on a time constant $\tau_1$ which is given by:

$$\tau_1 = \frac{R_1 R_2}{R_1 + R_2} C_1$$

This is graphically illustrated in the graph of FIG. 5 while the graphs of FIGS. 2, 3 and 4 show respectively the development of the gain of the TUNER as a function of the voltage $V_1$, the development of the gain of the IF STAGE as a function of the voltage $V_3$, and the development of the discharge current $I_1$ of the capacitor $C_1$ as a function of the voltage $V_3$ for various parameters $V_{REF}$ which can be selected by way of the variation of the parameter $R_T$.

Assuming that the voltage at the storage node 3 of the circuit for automatic control of the gain of the IF block is equal to a value $\overline{V}_3$, i.e. to the insertion limit of the TUNER DELAY block, if the antenna signal undergoes a large sudden increase, for example larger than 10 dB, the gain of the TUNER would not be able to undergo a corresponding instantaneous diminution as the time constant which regulates the operation of the automatic gain control loop is relatively high being, as already seen, given by:

$$\tau_1 = \frac{R_1 R_2}{R_1 + R_2} C_1$$

where $R_1$ and $R_2$ are the two resistors which form a voltage divider for charging the capacitor $C_1$ to a predefined voltage for supplying the pilot transistor of the HF-AGC.

Conversely the intermediate frequency stage will respond to this situation of sudden increment in the level of the signal at its input, i.e. at node 5 of FIG. 1, so as nevertheless to maintain constant the output level $V_{OUT}$ and this will occasion loading of an IF-AGC output storage capacitor $C_2$ (raising the voltage $V_3$) and simultaneously reducing the gain of the stage so as to compensate for the increase in level of the signal at its input. The response time of the IF-AGC is greatly less than the response time of the HF-AGC, but the presence of a signal with too high a level at the input node 5 of the IF STAGE creates inter-modulation and cross-modulation problems.

Naturally, when the increase in the level of the antenna signal is relatively slow, the problems do not exist since the HF-AGC is in itself able to contain the increase in the level of the signal at the output node 4 of the TUNER and consequently also at the node 5.

On the other hand, unexpected increases in the level of the antenna signal can occur suddenly and also temporarily, for example through the so-called "fast fading" phenomenon caused by a reflection of the arrival signal for example on the wings of an aircraft in transit.

It is a practical impossibility to reduce the time constant $\tau_1$ for spurious frequency filtering reasons, which would modulate the output of the TUNER which necessitate the use of a capacitor $C_1$ of large capacitance.

OBJECT AND SUMMARY OF THE INVENTION

The need therefore exists to reduce the response time of the HF-AGC so as to avoid an excessive increase in the level of the signal at the input of the intermediate frequency stage consequent upon autonomously uncontrollable sudden broad increases in the level of the antenna signal of the HF-AGC and which involve the activation of the so-called TUNER DELAY circuit of the dynamic automatic gain control loop without reducing the intrinsic time constant characteristics of the HF-AGC.

DESCRIPTION OF THE PREFERRED EMBODIMENT

Figure 6:
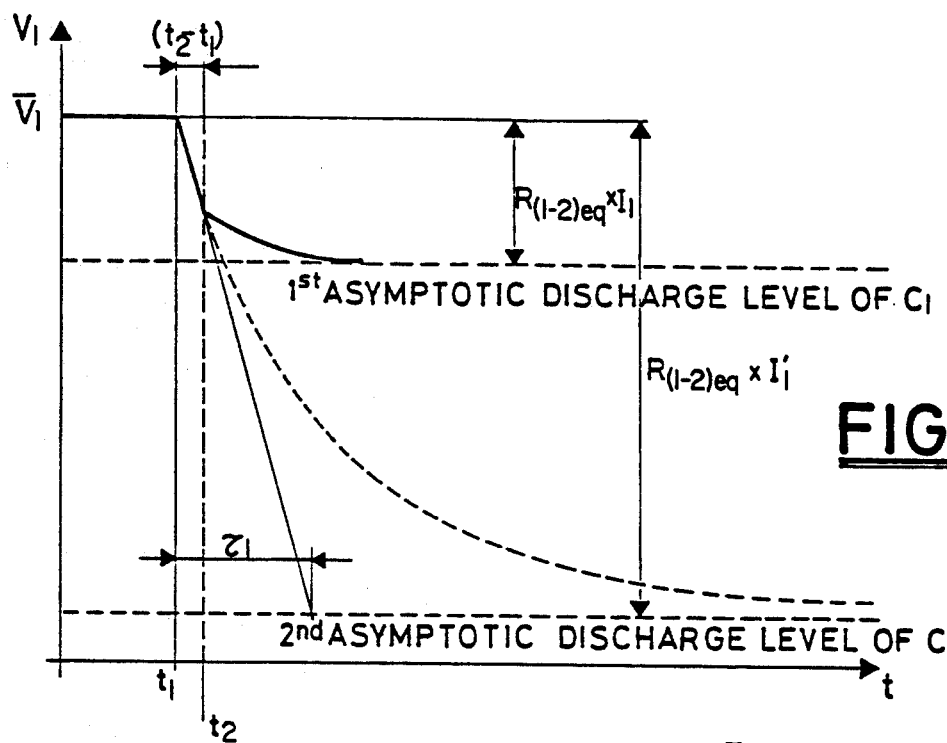
FIG. 6 is a graph which illustrates the mode of operation of the dynamic automatic gain control loop which is the subject of the present invention.

Basically, as illustrated graphically in the graph of FIG. 6, the system of the present invention allows the response time of the dynamic automatic gain control loop to be reduced without altering the intrinsic time constant characteristics thereof operating in such a way that the capacitor $C_1$ for storing the DC voltage for control of the gain of the HF-AGC of the TUNER is discharged, for a limited time, by a discharge current $I'_1$ suitably increased with respect to the predefined normal discharge current $I_1$ drawn by the normal TUNER DELAY circuit of the dynamic automatic gain control loop. In other words, the voltage $V_1$ for control of the HF-AGC, which under conditions of maximum gain of the HF-AGC of the TUNER has the value $\overline{V}_1$ (given by dividing the supply voltage by means of $R_1$ and $R_2$), diminishes in response to a front of variation of the level of the antenna signal of determined characteristics detected by the second system for automatic control of the IF-AGC gain of the intermediate frequency section of the receiver through the activation of the TUNER DELAY circuit which absorbs a discharge current $I_1$ from the capacitor $C_1$ as a function of a time constant $\tau_1 = R_{(1-2)eq} \cdot C_1$ tending to reduce the value of the voltage $V_1$ to a first asymptotic level given by the product $R_{(1-2)eq} \cdot I_1$ and for a first initial period of time $t_2 - t_1$, this diminution in the voltage $V_1$ follows a law which although being determined by the same time constant $\tau_1$ characteristic of the circuit, tends to a second asymptotic level given by the product $R_{(1-2)eq} \cdot I'_1$, where the discharge current of the capacitor $C_1$, $I'_1$, is equivalent to the sum of the current $I_1$ drawn by the TUNER DELAY circuit plus an additional discharge current $I_{tp}$ which, in the period $t_2 - t_1$, is drawn by a special discharge circuit operating essentially in parallel with the existing TUNER DELAY circuit.

Figure 1:
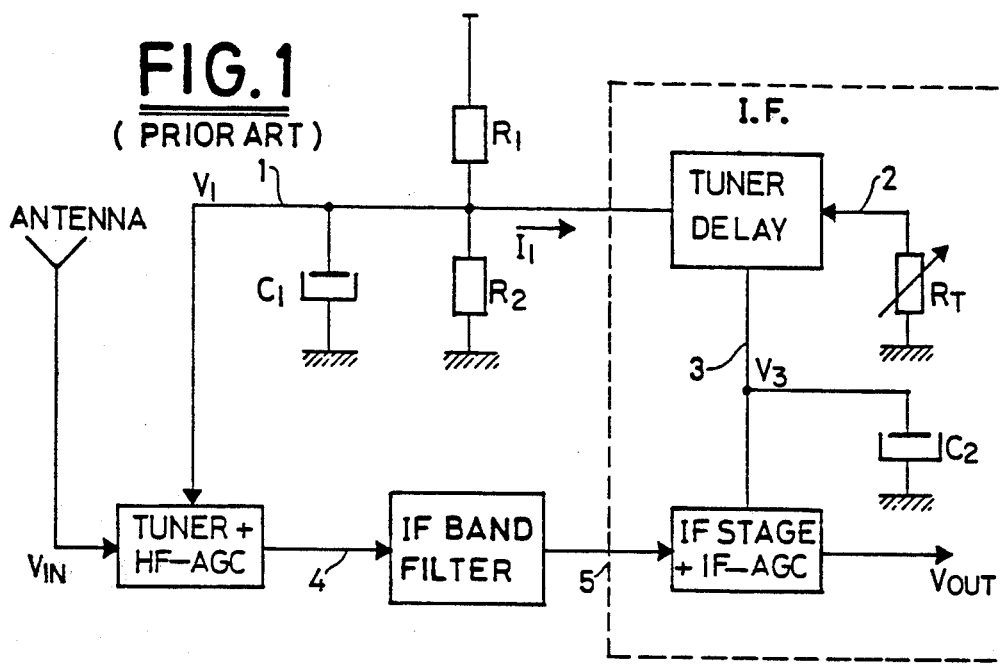
FIG. 1 is a block diagram of a typical input circuit of a superheterodyne TV receiver according to the known art, as already described previously.
Figure 2:
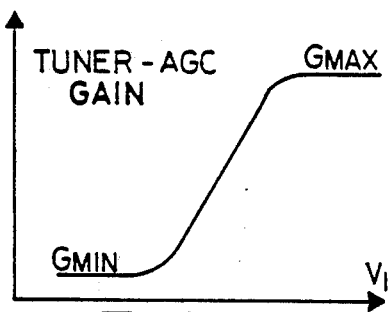
FIGS. 2, 3, 4 and 5 are graphs which illustrate the operation of the systems for automatic control of the gain of a receiver of FIG. 1, as already described previously.
Figure 3:
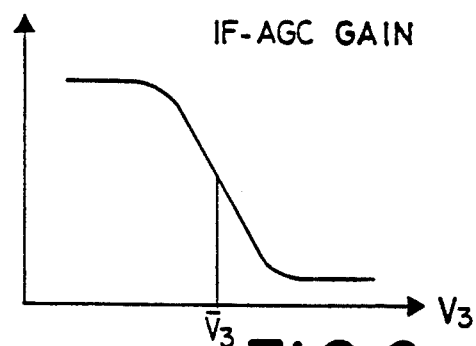
Figure 4:
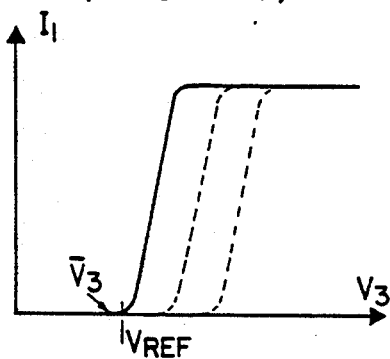
Figure 5:
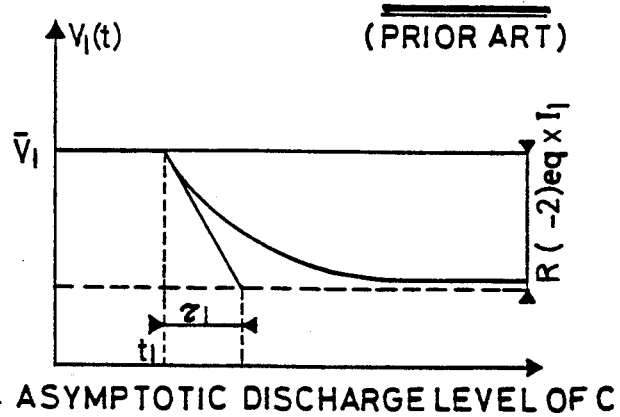
Figure 7:
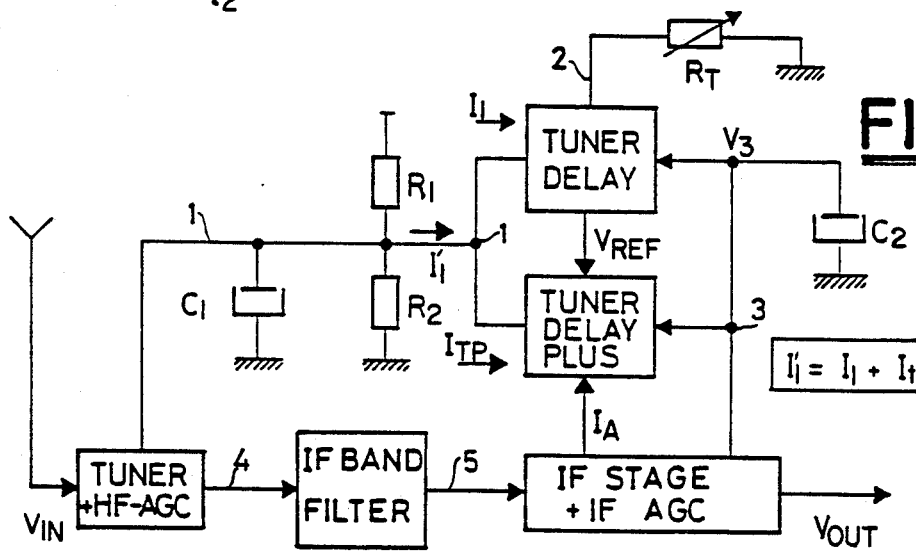
FIG. 7 is a block diagram of an input circuit of a superheterodyne receiver "equivalent" to the circuit of FIG. 1 but provided with an improved dynamic automatic gain control loop produced according to the present invention.

The circuit of the invention is shown in the block diagram of FIG. 7. Relative to the block circuit of a normal receiver of the prior art (FIG. 1) the dynamic automatic gain control loop comprises a second discharge circuit, called TUNER DELAY PLUS, to which is applied the same reference voltage $V_{REF}$ which establishes the intervention voltage level of the TUNER DELAY acting on the variable resistor $R_T$, as already described in relation to the circuit of the prior art of FIG. 1, as well as the voltage $V_3$ of the node for storing the DC voltage for control of the IF-AGC circuit (across the storage capacitor $C_2$) and a certain constant current $I_4$ which can be provided by the same automatic control circuit IF-AGC when the output of the IF-AGC circuit itself exceeds a determined threshold, this latter being a condition which, given the very high response speed of the IF-AGC system, can occur only in the presence of a sudden large increase in the antenna signal (e.g. $\geq 3$ dB) and which initiates an excursion of $V_3$ towards and possibly beyond the value $V_{REF}$.

In practice the activation of the TUNER DELAY PLUS circuit which is determined by the generation of said (enabling) current $I_4$ on the part of the IF-AGC and by a possible successive exceeding of the specified value $V_{REF}$ on the part of $V_3$, depends exclusively on the occurrence of a rising front of the output signal $V_3$ of the IF-AGC circuit and not on the value of a "DC component" thereof. Moreover, the TUNER DELAY PLUS circuit does not intervene if such a rapid variation in the value of the voltage $V_3$ (which induces the same IF-AGC circuit to liberate said enabling current $I_4$) occurs when the same voltage $V_3$ has already exceeded the preset value $V_{REF}$, insertion limit of the TUNER DELAY circuit.

Figure 8:
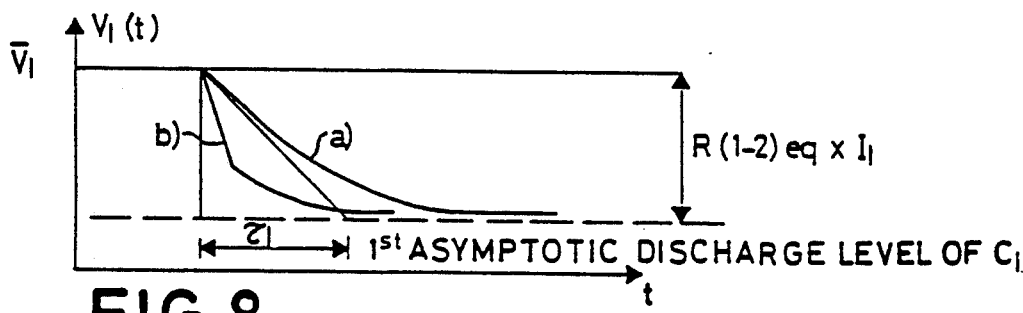
FIG. 8 is a graph which shows the operation of the dynamic automatic gain control loop in two different conditions one of which determines the activation of the special circuit which is the subject of the present invention.

Therefore, as graphically shown in FIG. 8, the dynamic automatic gain control loop can have two operating modes with the occurrence of respective conditions of increase in the level of the antenna signal $V_{IN}$. A first operating mode is that represented by the characteristic a) which is equivalent to the insertion of the TUNER DELAY circuit alone operating in entirely analogous mode to that of a circuit of the prior art whereas, on the occurrence of particular conditions of increase in the antenna signal, the operating mode of the loop becomes that represented by the characteristic b) relevant to the additional activation of the TUNER DELAY PLUS circuit of the invention besides the TUNER DELAY circuit with the evident effect of reducing the intervention delay time of the limiting action fulfilled by the HF-AGC circuit upstream of node 5 of the input circuitry of the superheterodyne receiver.

Figure 9:
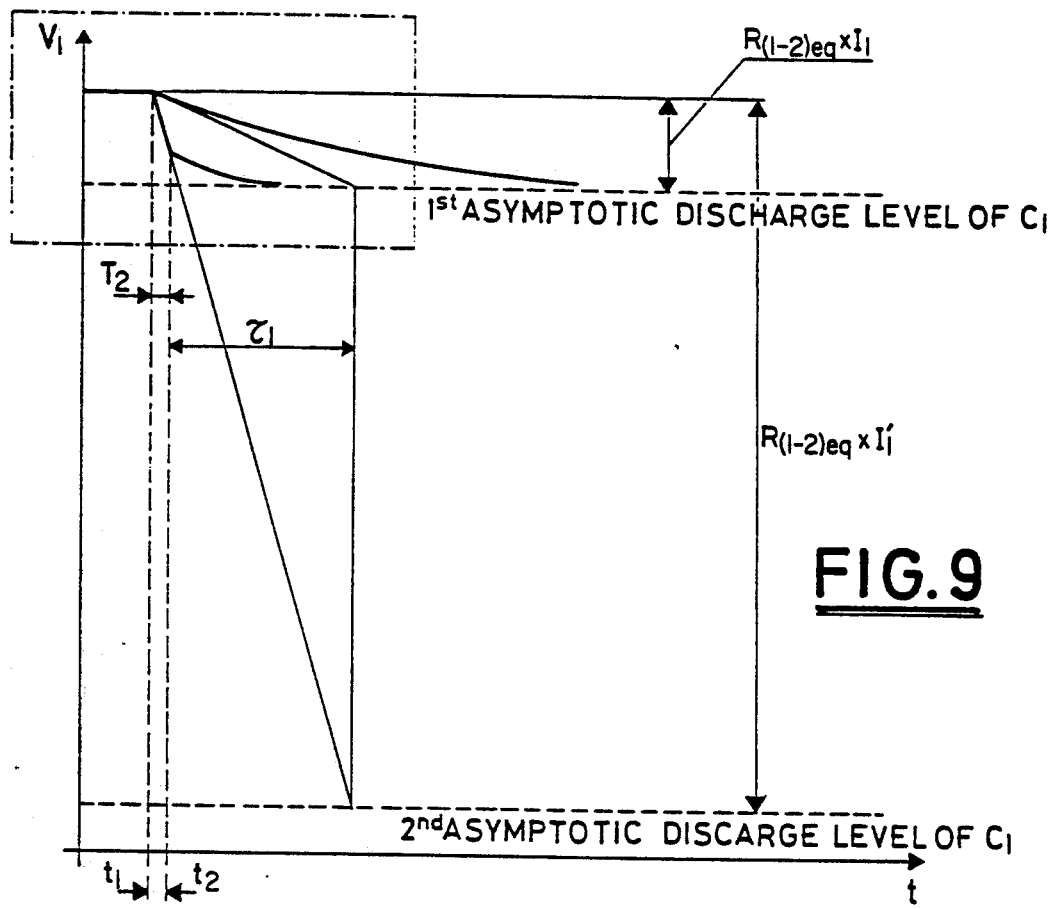
FIG. 9 is an explanatory graph of the operation of the circuit of the invention according to a determined embodiment of the latter.

The time graph of FIG. 8 represents in practice a partial illustration (zone delimited by the dashed-line frame) of the time graph of FIG. 9. A scale representation of the various magnitudes in the case of an exemplary embodiment of the invention is expressly maintained in this latter time graph. The effect of the temporary drawing of an additional discharge current from the capacitor $C_1$ by the special TUNER DELAY PLUS discharge circuit with the purpose of rendering more rapid the fall in the control voltage $V_1(t)$ of the HF-AGC of the receiver, determines the development of a discharge characteristic which is characterized, for a first tract, by a "pseudo time constant" $T_2$ smaller than the actual time constant of the circuit given by $\tau_1 = R_{(1-2)eq} \cdot C_1$. In the example considered $T_2 = \tau_1/15$. When the action of drawing the additional current $I_{tp}$ by the TUNER DELAY PLUS circuit ceases, the tension $V_1(t)$ reverts to following the trend dictated by the time constant $\tau_1$ as regards the first asymptotic discharge level of $C_1$ determined by the product $R_{(1-2)eq} \cdot I_1$. This TUNER DELAY PLUS intervention time interval $(t_2-t_1)$ should nevertheless never exceed the value $T_2$ given by:

$$T_2 = \tau_1 \frac{I_1}{I_1 + I_{tp}}$$

otherwise the capacitance $C_1$ would discharge excessively and the voltage $V_1(t)$ would drop below the asymptotic value given by: $V_1 - R_{(1-2)eq} \cdot I_1$.

An unacceptable situation is in fact that in which the voltage $V_1(t)$ drops excessively below the abovementioned asymptotic value, for example by an amount greater than 10% of $R_{(1-2)eq} \cdot I_1$. This condition of excessive diminution of the voltage $V_1(t)$ is graphically represented by the characteristic 1 of FIG. 10 where, for the purpose of comparison, the characteristic curve 5 relevant to the operation of the TUNER DELAY circuit alone without superposition of the action exercised by the TUNER DELAY PLUS circuit of the invention, is likewise indicated.

On the other hand if the TUNER DELAY PLUS circuit becomes disconnected before $V_1(t)$ has reached a value close to the asymptotic value, for example a value $V_1 - 0.9\, R_{(1-2)eq} \cdot I_1$ (i.e. greatly above the first asymptotic discharge level of the capacitor $C_1$), the effect of the special TUNER DELAY PLUS circuit would not be fully exploited. This condition is represented by the characteristic curve 3 of FIG. 10.

A preferable situation is that according to which the voltage $V_1(t)$ drops slightly below the asymptotic value, as represented by the characteristic 2 of FIG. 10.

Figure 10:
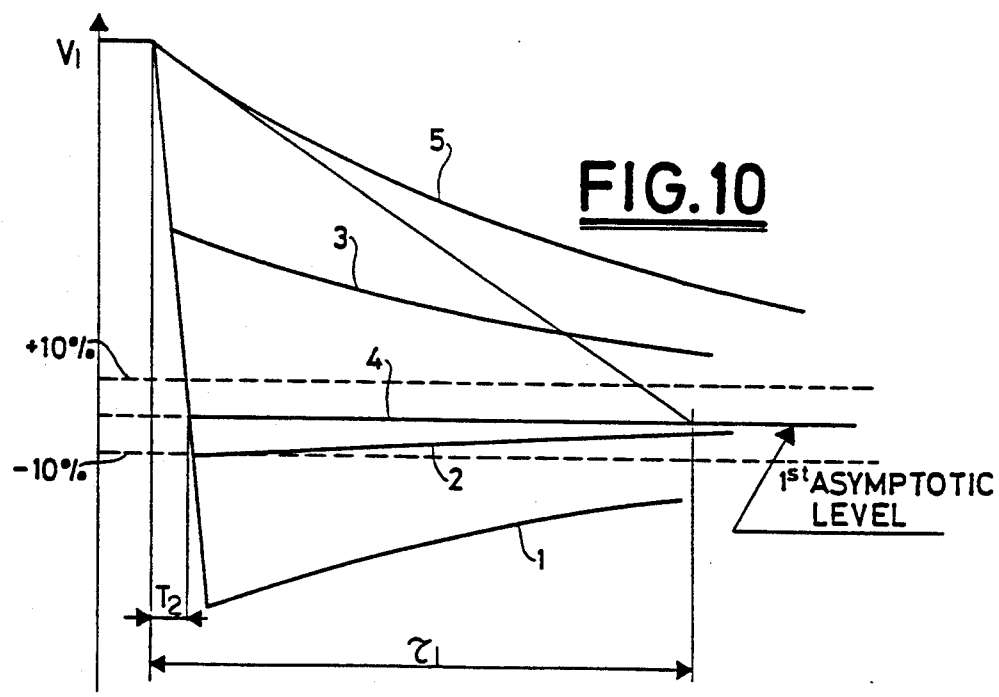
FIG. 10 is a graph which illustrates a particular aspect of the operation of the circuit of the invention, according to a determined embodiment of the latter.

In practice an optimal condition is that according to which the voltage $V_1(t)$ attains the asymptotic level in the shortest possible time as represented by the characteristic 4 of FIG. 10. This is attainable when operating in such a way that the TUNER DELAY PLUS circuit becomes disactivated at the instant at which the voltage $V_1(t)$ attains the asymptotic value, i.e. at a time $t_2 = T_2$, i.e. with the minimum time for attainment of the steady state equivalent to the value of said "pseudo time constant" $T_2$.

Naturally, an interval of ±10% relative to the value of the first asymptotic level, as indicated in the graph of FIG. 10, is an indicative design choice and represents a substantially satisfactory operating condition for the system.

Figure 11:
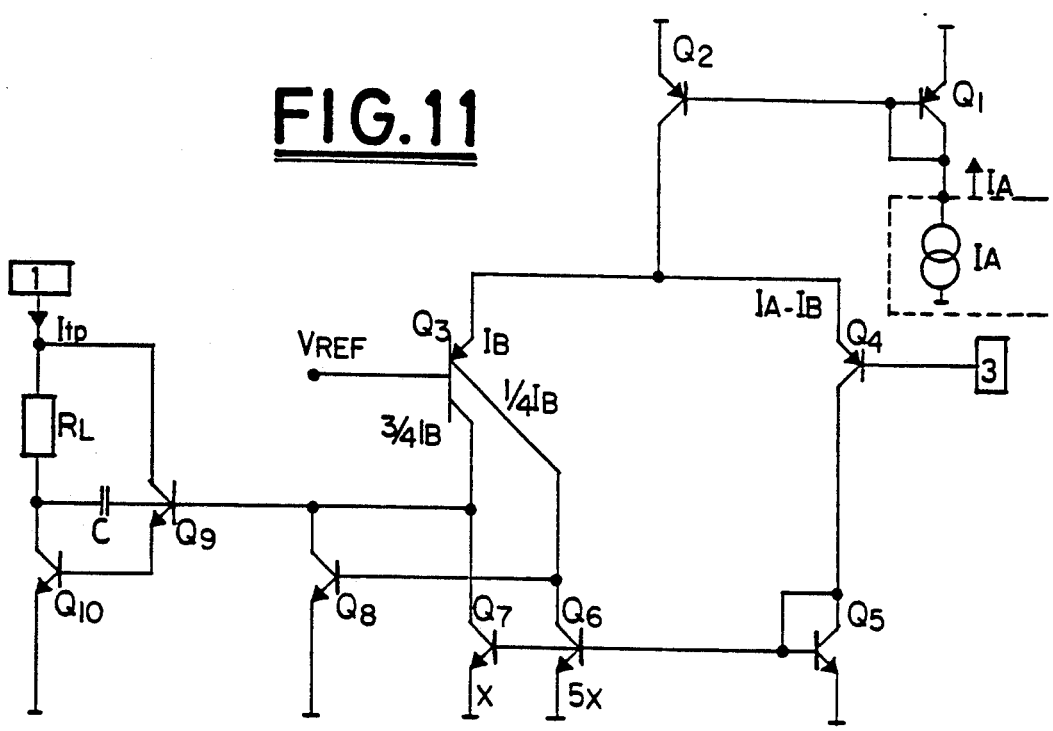
FIG. 11 is a circuit diagram of the special circuit of the invention according to a first embodiment.

According to one embodiment, the TUNER DELAY PLUS circuit of the invention can have the circuit diagram shown in FIG. 11 in which are indicated the connections to the respective circuit nodes 1 and 3 of the block diagram of FIG. 7, as well as the two input terminals to which are applied the voltage $V_{REF}$ and the enabling current $I_A$ respectively, which current, in the circuit diagram, is schematically shown generated by a generic generator of constant current $I_A$.

The circuit comprises a pair of transistors Q1 and Q2 which form a first current mirror for the input current $I_A$ which powers a differential circuit constituted by the transistors Q3 and Q4 of which the former is a transistor formed of two distinct fractional collectors, and a second differential-output current mirror formed by the transistors Q5 and Q6–Q7, these last two transistors being powered respectively through said two respective fractional collectors of the multiple-collector transistor Q3 of the differential, which constitute two distinct output nodes of the mirror. By means of one of these two output nodes there is directly driven ($t > t_1$) an output circuit composed of a Darlington transistor pair, Q9 and Q10, which represents an "open collector" capable of drawing or not a current $I_{tp}$ from the node 1, namely from storage node of the DC control voltage of the HF-AGC (across the capacitor $C_1$; FIG. 7) whereas a transistor Q8, connected between said node for driving the output circuit and ground, is driven by means of the other output node of the mirror so as to cut off the transistor pair of the output circuit after a certain period of time ($t = t_2$).

The operation of the circuit is as follows.

In a starting situation: $V_3 = \overline{V}_3 < V_{REF}$, with the arrival of a climbing front in the level of the signal at time $t = t_1$ such as to determine the delivery of an enabling current $I_A$, the latter is mirrored by Q1 and Q2 and passes through the transistor Q4 which renders it available to the transistor Q5 so as to then be mirrored by the transistors Q6 and Q7. Since Q3 is cut off ($I_B = 0$), no current is available at the collectors of the transistors Q6 and Q7 which then saturate almost dragging to ground the voltage present on the respective collectors. Under these conditions the transistors Q8, Q9 and Q10 remain cut off and no current is absorbed by the node 1.

At the instant at which the voltage $V_3$ begins to rise, the transistor Q3 starts to conduct ($I_B \neq 0$) providing current to the collectors of the transistors Q6 and Q7. It should be noted that the current $I_B$ divides up by $\frac{1}{4}$ on the collector of the transistor Q6 and by the remainders $\frac{3}{4}$ on the collector of the transistor Q7 as a function of the respective areas of the multiple collector zones of the transistor Q3.

Because of this fact and moreover bearing in mind the disparate ratio between the emitter areas of the transistors Q6 and Q7, where Q6 has an emitter area five times (5×) greater than the emitter area of the transistor Q7, the voltage on the base of the transistor Q9 will begin to increase.

More precisely, the transistor Q7 starts to desaturate at the instant $t_1$ at which:

$$\frac{3}{4} I_B = I_A - I_B \qquad I_B = \frac{4}{7} I_A$$

-continued $$V_3 - V_{REF} = V_T \ln \frac{I(Q3)}{I(Q4)} = V_T \ln \frac{4/7 \, I_A}{3/7 \, I_A} \approx 7 \text{ mV}$$

assuming the constant $V_T = \frac{KT}{Q} \approx 25 \text{ mV}$.

From this instant onwards ($t > t_1$ and with the voltage $V_3$ exceeding $V_{REF}$) a current $i_x$ is available for the base of Q9, which will produce a current $\beta \cdot i_x$ for the base of Q10 and hence the total current $I_{tp}$ absorbed by the node 1 will be given by:

$$\beta(\beta+1)i_x \approx \beta^2 i_x$$

Only when the voltage at node 3 of the circuit of FIG. 7 has further increased (and hence after a certain delay), will the transistor Q6 also begin to leave the saturated condition.

The transistor Q6 starts to desaturate at the instant $t_2$ at which:

$$\frac{1}{4} I_B = 5 (I_A - I_B) \qquad I_B = \frac{20}{21} I_A$$

$$V_3 - V_{REF} = V_T \ln \frac{I_C(Q3)}{I_C(Q4)} = V_T \ln \frac{20/21 \, I_A}{1/21 \, I_A} \approx 75 \text{ mV}$$

i.e. practically when the differential constituted by the two transistors Q3 and Q4 becomes completely unbalanced and hence the transistor Q4 is off.

From the instant $t_2$ onwards, ¼ of the current $I_B$ enters the base of Q8, for which the collector current of Q8 is given by $\beta I_B/4$ which is certainly larger than $3 I_B/4$. As a result the saturation of Q8 is obtained and hence the cutting off of the pair of transistors Q9 and Q10.

As has been stated previously, the TUNER DELAY PLUS circuit must not intervene despite the existence of an enabling current $I_A$ in the case in which the voltage $V_3$ has already exceeded the value $V_{REF}$.

Under this last condition the differential is in fact already unbalanced, and the collector current of Q8 being equal to $\beta I_B/4$ and hence larger than $3 I_B/4$, no base current would be available for Q9; this however if the response time of Q8 were instantaneous. Since this is not the case, this instantaneous current available at the base of Q9 has to be discharged and this is obtained through the capacitance C, avoiding a multiplication by $\beta^2$.

Figure 12:
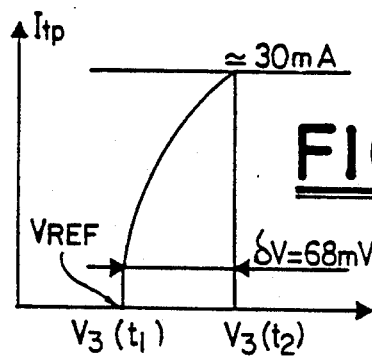
FIG. 12 is a graph which shows the development of the discharge current absorbed by the special circuit of the invention.

Referring again to the functional block diagram of FIG. 7 and summarizing, the development of the current $I_{tp}$ can be represented graphically as in FIG. 12. The maximum value obtainable by the current peak $I_{tp}$ is equivalent to about $\beta^2 \, 3 \, I_B/4$.

Hence it is possible to attain relatively high values of current, typically about 30 mA, and with the purpose of limiting excessive values a resistor $R_L$ can be introduced into the circuit diagram of the TUNER DELAY PLUS circuit of FIG. 11.

A typical current peak $I_{tp}$ absorbed by the circuit in the time interval between $t_1$ and $t_2$ is shown graphically in FIG. 12.

Figure 13:
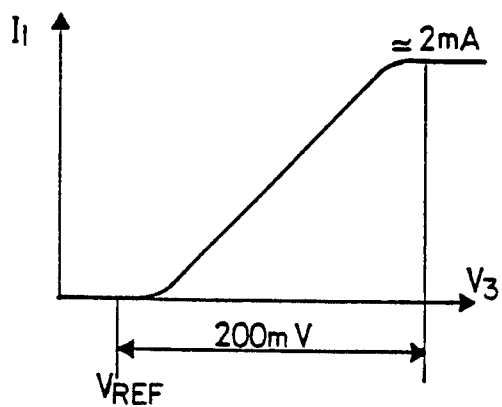
FIG. 13 is a graph which shows the development of the discharge current absorbed by the normal TUNER DELAY circuit.

Furthermore, the development of the discharge current $I_1$ absorbed by the TUNER DELAY CIRCUIT is shown graphically in the graph of FIG. 13.

Figure 14:
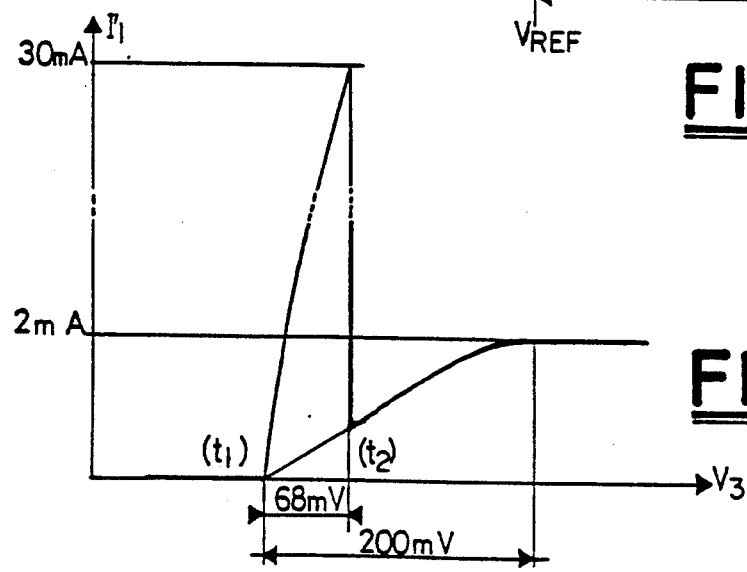
FIG. 14 is a graph which shows the development of the total discharge current absorbed jointly by the normal TUNER DELAY circuit and by the auxiliary discharge circuit of the invention, when the latter is triggered.

The overall effect of the two circuits (TUNER DELAY and TUNER DELAY PLUS) acting substantially in parallel with one another in case both are activated, is that represented graphically in the graph of FIG. 14 which represents the development of the discharge current $I'_1$ of the capacitor $C_1$ for storing the DC voltage for controlling the HF-AGC circuit.

Returning to consider an exemplary embodiment described in relation to the graph of FIG. 9 and wishing the additional circuit of the invention referred to as TUNER DELAY PLUS to remain switched on until the voltage $V_1(t)$ becomes equal to the value of the first asymptotic level (characteristic 4 of the graph of FIG. 10), i.e. for a time $T_2 = \tau_1/15$, the equation:

$$\frac{I_{IF}}{C_2} = \frac{\delta V}{T_2}$$

must be satisfied, where $I_{IF}$ is the discharge current of the capacitor $C_2$ of the IF-AGC circuit and $\delta V$ equals 75 mV − 7 mV = 68 mV.

This value of $\delta V$ might not be sufficient for the equality $t_2 - t_1 = T_2$, to be satisfied, in fact $I_{IF}$ is fixed, $C_2$ is a specified design value and $T_2 = \tau_1/n$, where $\tau_1$ is specified in the design phase, R1, R2 and C1 usually being discrete external components and n is the number of times which it is wished to reduce the effective time constant of the system by way of activation of the additional circuit of the invention, TUNER DELAY PLUS.

Two different possibilities exist for increasing the value of $\delta V$, having determined the value n (equal to 15 in the example proposed) and the fractionalizing of Q3:

a) further increasing the emitter area of the transistor Q6 relative to Q7, for example from 5× to 10×; or b) introducing resistors between the emitter of Q7 and ground and between the emitter of Q5 and ground.

In the event of adopting the first solution and the emitter area of the transistor Q6 becoming 10 times the area of Q7 (10×) there will be obtained:

$$\frac{1}{4} I_B = 10(I_A - I_B) \qquad I_B = \frac{40}{41} I_A$$

$$V_3 - V_{REF} = V_T \ln \frac{40/41 \, I_A}{1/41 \, I_A} \approx 92 \text{ mV}$$

and hence $\delta V = 92$ mV − 7 mV = 85 mV.

Figure 15:
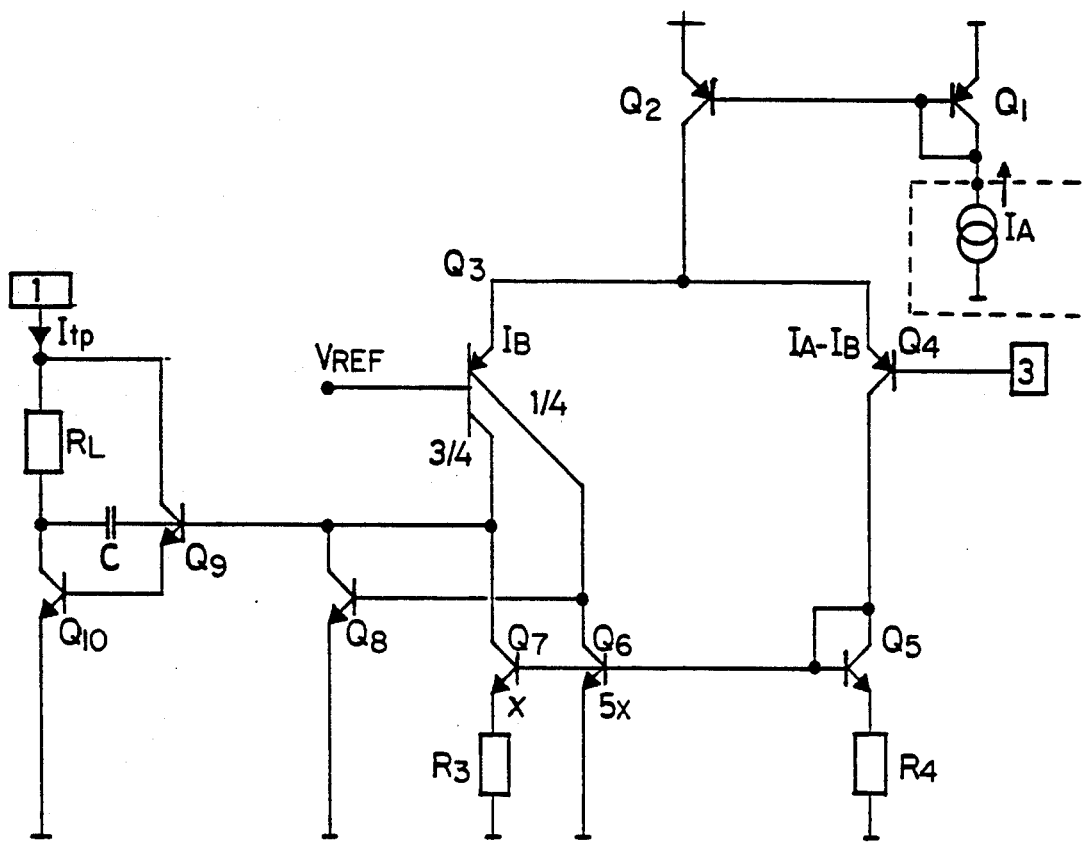
FIG. 15 is the circuit diagram of the special circuit of the invention according to a second embodiment.

In the event of adopting the second solution according to the modified circuit diagram of FIG. 15, the two resistors R3 and R4 do not modify the mirror ratio between Q5 and Q7 which still remains unitary and hence the additional discharge current $I_{tp}$ becomes available from the moment at which $V_3 - V_{REF} = 7$ mV. Assuming that the two resistors R3 and R4 both have the value R, the following transcendental equation will hold:

$$\frac{(I_A - I_B) R}{V_T}$$

$$\frac{1}{4} I_B = 5(I_A - I_B) \text{ and}$$

(again assuming that the transistor Q6 has an emitter area 5 times greater than the area of the transistor Q7).

Setting $I_A = 10$ μA and $R = 20$ kΩ, $I_B \approx 9.64$ μA and hence $$V_3 - V_{REF} = V_T \ln \frac{I_B}{I_A - I_B} \approx 82 \text{ mV}$$

and hence $\delta V = 82 \text{ mV} - 7 \text{ mV} = 75 \text{ mV}$.

If simultaneously the transistor Q6 is made with an area 10 times greater than Q7, the transcendental equation will be modified in the following way:

$$\frac{(I_A - I_B) R}{V_T}$$

$$\frac{1}{4} I_B = 10(I_A - I_B) \text{ and}$$

and has as solution $I_B \approx 9.79 \ \mu A$ from which it results that $V_3 - V_{REF} = 96 \text{ mV}$ and $\delta V = 89 \text{ mV}$.

Modifying in this way the limits of $\delta V$, namely the respective values which when attained by the voltage $V_3(t)$ determine firstly the desaturating of the transistor Q7 ($t_1$) modifying the fractionalizing of Q3 and then of the transistor Q6 ($t_2$), the start and the duration of the peak discharge current absorbed by the circuit (FIGS. 12 and 14) can be modified.

Naturally the ways in which said current $I_A$ can be generated or liberated when the level of the output signal $V_{OUT}$ of the IF STAGE exceeds a determined threshold, which, given the extreme rapidity of response of the IF-AGC, can happen only in the presence of a sudden climb in the level of the signal at the input of the same IF STAGE (node 5), can be different and all easily recognizable by a person skilled in the art. The use of a differential stage, to one input of which is applied a certain reference voltage and to the other input of which is applied a signal replica of the level of the signal from the IF-AGC representing one of the circuital arrangements suitable for generating said current $I_A$ for activating the TUNER DELAY PLUS circuit of the invention.

What we claim is:

1. A superheterodyne receiver comprising an input circuit defining a signal processing path having an input for receiving the signal and an output and comprising in series between said input and said output a wideband amplification stage provided with a first automatic gain control circuit for controlling the amplitude of the amplified signal, a tuner circuit for preselecting the signal, a mixer stage for deriving an intermediate frequency signal from the amplified signal provided by said wideband amplification circuit and from said tuner circuit, a band filter for said intermediate frequency cascade-connected to said mixer stage and an intermediate frequency circuit comprising at least one amplifier provided with a second automatic gain control circuit for controlling the amplitude of the intermediate frequency signal produced at said output:

said first automatic gain control circuit having a first capacitor for storing a first gain control voltage, which regulates the gain of said wideband amplification stage;

said second automatic gain control circuit having a second capacitor for storing a second gain control voltage, which regulates the gain of said intermediate frequency stage;

and a dynamic automatic gain control loop of the overall gain of said input circuit of the receiver capable of compensating also for fast changes of the level of the signal received that are not controllable by said first automatic gain control circuit, which loop comprises a first discharge circuit capable of drawing a first discharge current from said first storage capacitor with a predefined time constant to lower said first gain control voltage towards a first asymptotic value to reduce the gain when the DC voltage across said second storage capacitor exceeds a preset value, and characterized by further comprising a second discharge circuit capable of drawing a second additional discharge current from said first storage capacitor of said first automatic gain control circuit for a time sufficient to lower said first gain control voltage to said first asymptotic value faster than it would be determined by said predefined time constant;

said second discharge circuit intervening to draw said additional discharge current only if the condition for exceeding said preset value by said second gain control voltage across the storage capacitor of said second automatic gain control circuit is preceded by the occurrence of a signal level condition at the input of said intermediate frequency circuit greater than a threshold level.

2. The receiver as claimed in claim 1 wherein said signal level condition at the input of said intermediate frequency circuit greater than a preset maximum level causes said intermediate frequency circuit to generate and deliver an enabling current to an input terminal of said second discharge circuit.

3. The receiver as claimed in claim 2, wherein said second discharge circuit is composed of:

a first current mirror at an input terminal of which is supplied said enabling current and having an output terminal;

a differential circuit composed of a first transistor and of a second transistor having emitters which are connected up in common to said output terminal of said first current mirror, said first transistor having a base to which is applied said voltage present across the storage capacitor of said second automatic gain control circuit and a collector connected to an input node of a second current mirror, said second transistor having a base to which is applied a voltage having said preset value, a first collector having a certain area and a second collector having a fractional area relative to the area of said first collector, said first and second collectors being connected respectively to a first and to a second output node of said second current mirror, which output nodes of said second current mirror being maintained at a common supply potential by way of two respective output transistors of said second mirror to the extent that said output transistors are saturated by absence of current provided respectively from said first and second fractional collectors of the second transistor of the differential circuit;

a Darlington output circuit composed of a transistor pair, a load-limiting resistor connected to the collector of the output transistor of the transistor pair, a capacitor connected between the base of the input transistor and the collector of the output transistor of the transistor pair, the collector node of the Darlington pair being connected to the storage node of the first gain control voltage of said first automatic gain control circuit, the base of the input transistor of said Darlington pair being connected to said first output node of said second current mirror; and a transistor connected between said first output node of said second current mirror and the node of said common supply potential and having a base connected to said second output node of said second current mirror;

said first and second output transistors of said second mirror sequentially desaturating following a progressive umbalance of said differential circuit and the desaturation of said first output transistor determining the instant of turning on of said Darlington transistor pair and the desaturation of said second output transistor determining the instant of turning off of said Darlington transistor pair.

4. The circuit as claimed in claim 3, wherein said second current mirror is formed by a first input transistor and by a second and a third output transistors which are respectively connected in series to said first collector and to said second collector of said second transistor of the differential circuit and have bases connected in common to the base of said first transistor;

said third output transistor having an area larger than the area of said second output transistor of the mirror.

5. The receiver as claimed in claim 4, wherein a resistor is connected between the emitter of said first input transistor and between the emitter of said second output transistor of said second current mirror and ground.

6. A receiver automatic gain control circuit, comprising:

a tuner receiving an input signal and outputting an IF signal, said tuner including a first amplifier stage having a gain controlled by a first signal;

an IF stage receiving said IF signal and outputting a second signal, said IF stage generating a third signal, the value of the third signal being selected to maintain the amplitude of said second signal approximately constant;

a tuner delay circuit operatively receiving said third signal and varying said first signal in response thereto such that said first signal is controlled according to a first time constant; and a tuner delay plus circuit operatively receiving said third signal and varying said first signal in response to a period of rapid increase in the amplitude of said third signal so that said first signal is controlled according to a second time constant during said period of rapid increase, said second time constant being less than said first time constant to cause said first signal to be simultaneously controlled by said tuner delay circuit and said tuner delay plus circuit during said period of rapid increase.

7. The apparatus according to claim 6 wherein said tuner delay plus circuit varies said first signal only if said rapid increase in the amplitude of said third signal begins when its amplitude is less than the amplitude of a reference signal.

8. The apparatus according to claim 6 wherein said first signal is a first voltage across a capacitor, said first voltage being asymptotically discharged by said tuner delay circuit at a rate determined by said first time constant to an asymptotic value if the amplitude of said third signal exceeds the amplitude of a reference voltage.

9. The apparatus according to claim 8 wherein said tuner delay plus circuit asymptotically discharges said capacitor at a rate determined by said second time constant to a value approximately equal to said asymptotic value if the amplitude of said third signal exceeds the amplitude of a reference voltage.

10. The apparatus according to claim 6, further including means within said IF stage for generating an enabling current in response to said period of rapid increase.

11. The apparatus according to claim 10 wherein said tuner delay plus circuit is enabled by said enabling current only if said period of rapid increase begins when the amplitude of said third signal is less than the amplitude of said reference voltage.

12. An automatic gain control circuit, comprising:

a first amplifier stage having a first input, a first output, and a gain controlled by a first control voltage;

a second amplifier stage having a second input coupled to said first output, a second output, and generating a second control voltage, said second control voltage being indicative of the amplitude of said second output;

a first discharge stage, coupled to said second control voltage and varying said first control voltage such that said first control voltage is controlled by a first time constant; and a second discharge stage, coupled to said second control voltage and responsive to a rapid increase in said second control voltage, said second discharge stage varying said first control voltage such that said first control voltage is controlled by a second time constant during said period of rapid increase, said second time constant being less then said first time constant.

13. The apparatus according to claim 12 wherein said second discharge circuit discharges said first control voltage only if said rapid increase in said second control voltage occurs when said second control voltage is less than a reference voltage.

14. The apparatus according to claim 12 wherein said first control voltage is the voltage across a capacitor, said first control voltage being asymptotically discharged by said first discharge stage at a rate determined by said first time constant to an asymptotic value if the amplitude of said second control voltage exceeds the amplitude of a reference voltage.

15. The apparatus according to claim 14 wherein said second discharge stage asymptotically discharges said capacitor at a rate determined by said second time constant to a value approximately equal to said asymptotic value if the amplitude of said second control voltage exceeds the amplitude of a reference voltage.

16. The apparatus according to claim 15 wherein said first and second discharge stages are coupled in parallel to said capacitor, whereby said first control voltage is discharged at said first time constant if said second control voltage exceeds said reference voltage or at said second time constant if said rapid increase in said second control voltage begins before said second voltage exceeds said reference voltage.

17. A method of maintaining an output signal substantially constant in response to a variable input signal, comprising the steps of:

(a) amplifying the input signal under control of a first gain control signal to produce an intermediate signal;

(b) generating a second gain control signal having an amplitude dependent upon the magnitude of the output signal;

(c) amplifying said intermediate signal to produce the output signal;

(d) varying said first gain control signal according to a first time constant when said second gain control signal is not rapidly increasing and when said second gain control signal is above a predetermined voltage threshold; and (e) varying said first gain control signal according to a second time constant when said second gain control signal is rapidly increasing.

18. The method of claim 17 wherein said step of varying said first gain control signal according to said second time constant only if the rapid increase in the amplitude of said second gain control signal begins when said second gain control signal is below said predetermined voltage threshold.

19. The method of claim 17 wherein said first gain control signal is the voltage across a capacitor and said step of varying said first gain control signal according to said first time constant asymptotically discharging said capacitor at a rate determined by said first time constant to an asymptotic value if the amplitude of said second gain control signal exceeds the amplitude of said predetermined voltage threshold.

20. The method of claim 19 wherein said step of varying said first gain control signal according to said second time constant asymptotically discharges said capacitor at a rate determined by said second time constant to said asymptotic value if the rapid increase in the amplitude of said second gain control signal begins before the amplitude of said second gain control signal exceeds the amplitude of said predetermined voltage threshold.

21. The method of claim 20 wherein said steps d and e discharge said capacitor in parallel, such that said first gain control signal is discharged at said first time constant if said second gain control signal exceeds said predetermined voltage threshold or at said second time constant if said rapid increase in said second gain control signal begins before said second gain control signal exceeds said predetermined voltage threshold.

* * * * *

UNITED STATES PATENT AND TRADEMARK OFFICE
CERTIFICATE OF CORRECTION

PATENT NO. : 5,263,186
DATED : November 16, 1993
INVENTOR(S) : Silvano Gornati et al.

It is certified that error appears in the above-identified patent and that said Letters Patent is hereby corrected as shown below:

On the title page: Item [54] and Column 1, line 2, delete "REPSONSE" and substitute therefor --RESPONSE--.

Signed and Sealed this

Twenty-fourth Day of May, 1994

Attest:

BRUCE LEHMAN

Attesting Officer       Commissioner of Patents and Trademarks